US008513757B1

(12) United States Patent
Tam et al.

(10) Patent No.: US 8,513,757 B1
(45) Date of Patent: Aug. 20, 2013

(54) COVER FOR IMAGE SENSOR ASSEMBLY WITH LIGHT ABSORBING LAYER AND ALIGNMENT FEATURES

(75) Inventors: Terence N. Tam, San Francisco, CA (US); Jeffrey N. Gleason, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/552,164

(22) Filed: Jul. 18, 2012

Related U.S. Application Data

(60) Provisional application No. 61/657,625, filed on Jun. 8, 2012.

(51) Int. Cl.
*H01L 31/0203* (2006.01)
*H01L 21/00* (2006.01)

(52) U.S. Cl.
USPC .............................. 257/434; 257/433; 438/57

(58) Field of Classification Search
CPC ..................... H01L 31/0203; H01L 27/14618; H01L 2924/01079
USPC ..................... 257/431, 433, 434; 438/57, 73, 438/75
See application file for complete search history.

(56) References Cited

U.S. PATENT DOCUMENTS

| 6,616,480 | B2 * | 9/2003 | Kameyama | 439/587 |
|---|---|---|---|---|
| 7,576,402 | B2 * | 8/2009 | Noma | 257/432 |
| 7,915,717 | B2 | 3/2011 | Rezende | |
| 7,948,555 | B2 | 5/2011 | Kwon et al. | |
| 2006/0006486 | A1 * | 1/2006 | Seo et al. | 257/433 |
| 2011/0024862 | A1 | 2/2011 | Tu et al. | |
| 2011/0156188 | A1 | 6/2011 | Tu et al. | |
| 2012/0014687 | A1 * | 1/2012 | Sanford | 396/535 |

FOREIGN PATENT DOCUMENTS

EP          2341540 A2     7/2011

* cited by examiner

*Primary Examiner* — Nikolay Yushin
(74) *Attorney, Agent, or Firm* — Blakely, Sokoloff, Taylor & Zafman LLP

(57) ABSTRACT

An image sensor assembly includes an image sensor die attached adjacent to a cavity and a lower surface in a preformed package having substantially vertical surfaces extending from the lower surface to an upper surface of the package. The image sensor die provides the light receiving surface for capturing the image. A light absorbing layer is applied to a cover such that the light absorbing layer prevents light from falling on the substantially vertical surfaces of the preformed package without preventing the passage of light that falls on the light receiving surface of the image sensor die. The light absorbing layer includes openings that provide a line-of-sight view of two opposing corners of at least one of the light receiving surface and the image sensor die to facilitate placing the cover over the upper surface of the package in registry with the image sensor die.

23 Claims, 3 Drawing Sheets

COVER FOR IMAGE SENSOR ASSEMBLY WITH LIGHT ABSORBING LAYER AND ALIGNMENT FEATURES

CROSS REFERENCE TO RELATED APPLICATIONS

This application claims the benefit pursuant to 35 U.S.C. 119(e) of U.S. Provisional Application No. 61/657,625, filed Jun. 8, 2012, which application is specifically incorporated herein, in its entirety, by reference.

BACKGROUND

1. Field

Embodiments of the invention relate to the field of electronic image sensors; and more specifically, to electronic image sensors with means for attenuating spurious reflected light.

2. Background

Electronic image sensors allow images to be captured in electronic form. Such sensors replace film in digital cameras and allow a camera function to be added to a variety of electronic devices such as cellular telephones, computers, and personal digital assistants. Image sensors are generally provided in the form of image sensor assemblies. The light that forms the image must fall on a light receiving surface of an image sensor die to capture the image. Therefore the image sensor die is provided in a package that is covered by a material that allows passage of image forming light through to the light receiving surface. An image sensor assembly may include the image forming optics or may provide the image sensor to be used with external optics.

The image sensor die is often attached adjacent to a lower end of a cavity in the package. The cavity will often have vertical walls adjacent the image sensor die. Light can strike these vertical walls and be reflected onto the light receiving surface of the image sensor die and degrade the image. This reflected light may cause stray light to be cast toward the edge of the image.

It would be desirable to provide an image sensor assembly that reduces image degradation caused by light reflected from the vertical walls of the package cavity that houses the image sensor die.

SUMMARY

An image sensor assembly includes an image sensor die attached adjacent to a cavity and a lower surface in a preformed package having substantially vertical surfaces extending from the lower surface to an upper surface of the package. The image sensor die provides the light receiving surface, such as an image sensor array, for capturing the image. A light absorbing layer is applied to a cover such that the light absorbing layer prevents light from falling on the substantially vertical surfaces of the preformed package without preventing the passage of light that falls on the light receiving surface of the image sensor die. The light absorbing layer includes openings that provide a line-of-sight view of two opposing corners of at least one of the light receiving surface and the image sensor die to facilitate placing the cover over the upper surface of the package in registry with the image sensor die. The cover may be a glass cover or an infrared cut filter.

Other features and advantages of the present invention will be apparent from the accompanying drawings and from the detailed description that follows below.

BRIEF DESCRIPTION OF THE DRAWINGS

The invention may best be understood by referring to the following description and accompanying drawings that are used to illustrate embodiments of the invention by way of example and not limitation. In the drawings, in which like reference numerals indicate similar elements.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
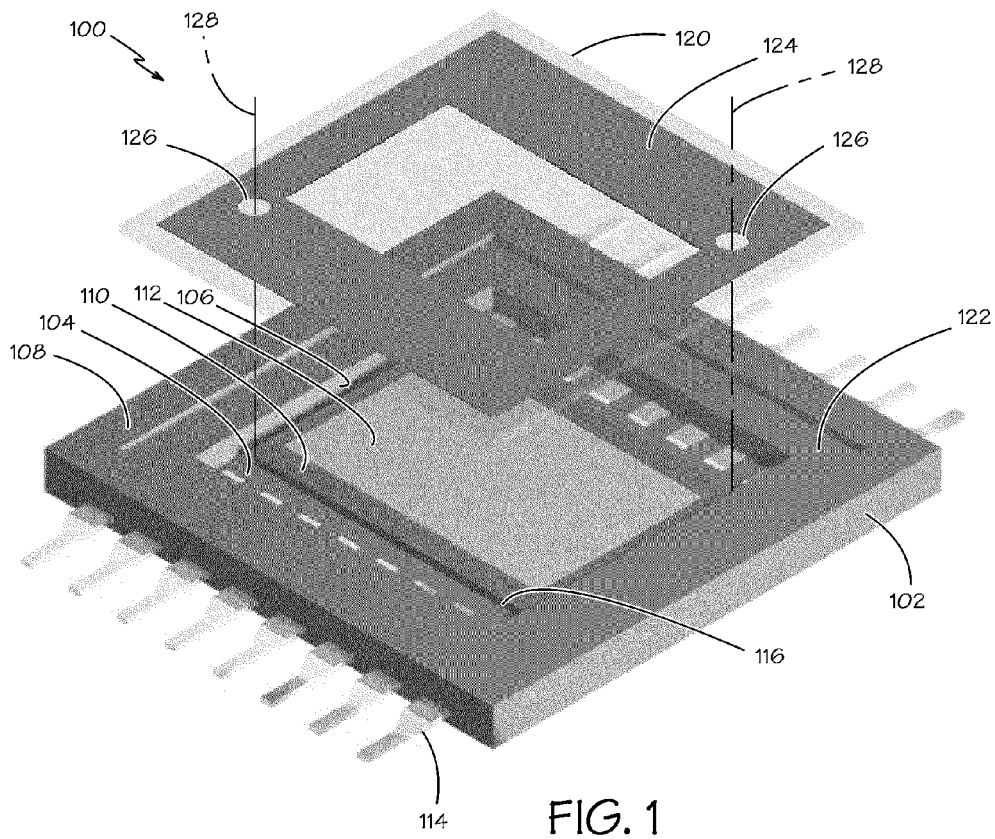
FIG. 1 is an exploded view of an image sensor assembly that embodies the invention.
Figure 2:
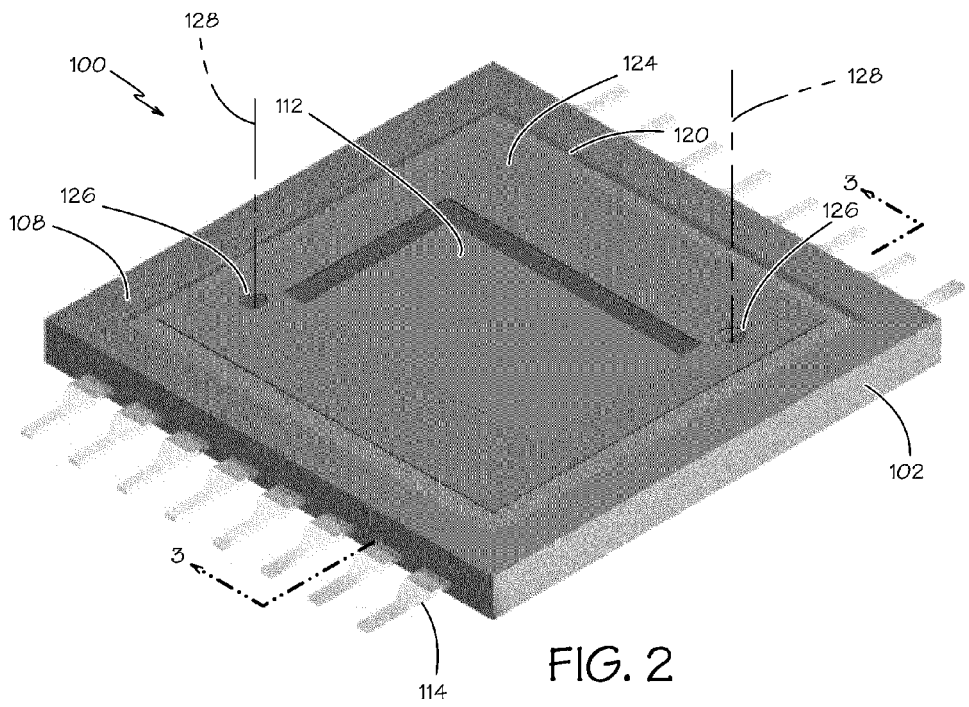
FIG. 2 is an assembled view of the image sensor assembly of FIG. 1.
Figure 3:
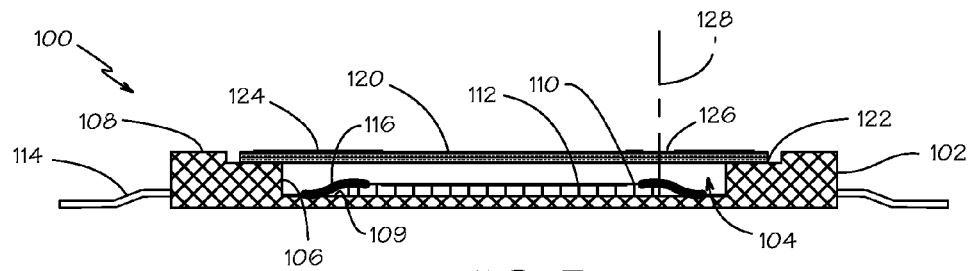
FIG. 3 is a section view of the image sensor assembly along line 3-3 of FIG. 2.
Figure 4:
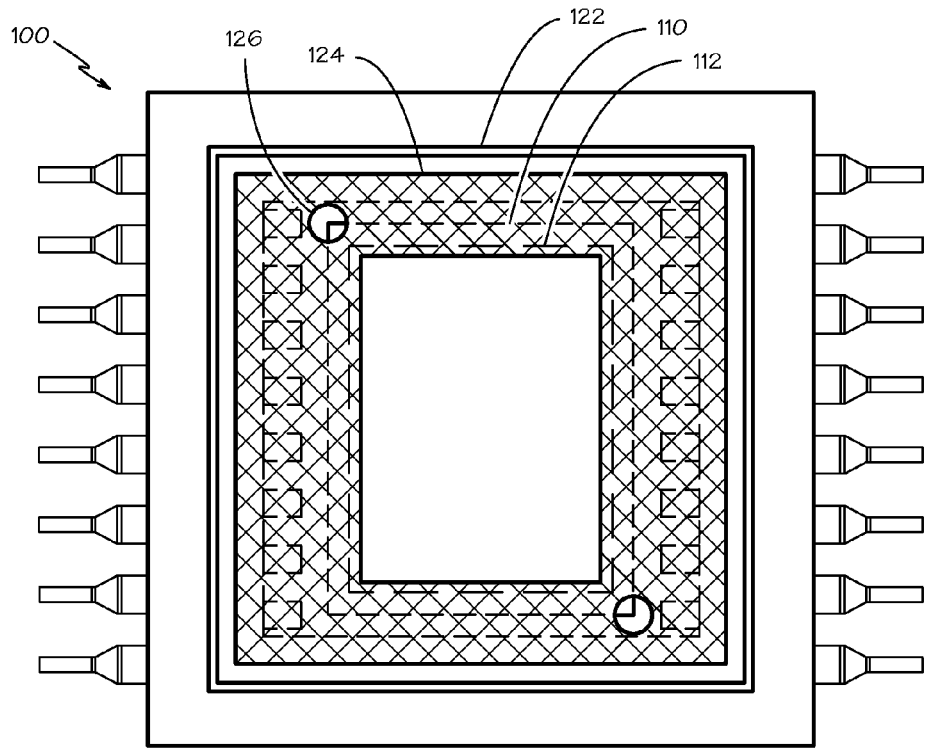
FIG. 4 is a plan view of the image sensor assembly of FIG. 1.

FIG. 1 shows an exploded view of an image sensor assembly 100 that embodies the invention. FIG. 2 shows an assembled view of the image sensor assembly of FIG. 1. FIG. 3 is a section view of the image sensor assembly along line 3-3 of FIG. 2. FIG. 4 shows a plan view of the image sensor assembly of FIG. 1.

The image sensor assembly 100 includes a package 102, which may be a preformed ceramic member, that includes a cavity 104 having substantially vertical surfaces 106 extending from a lower surface 109 to an upper surface 108 of the package. An image sensor die 110 is attached to the package 102 adjacent the cavity 104 and the lower surface of the package. The image sensor die 110 has a light receiving surface, which may be an image sensor array 112, for capturing an image. The image sensor die 110 may include a charge-coupled device or an active pixel sensor imager that provides the image sensor array 112 for capturing the image. The image sensor die 110 may be part of a chip-on-board (COB) assembly. The package 102 will typically provide external electrical connections 114, such as pins, a ball grid array, or surface mount connections, that are electrically coupled 116 to the image sensor die 110.

A cover 120 is placed over the upper surface 108 of the package 102. Placed over the upper surface of the package should be understood to mean placed adjacent the surface of the package that is closest to the image forming optics. The cover 120 may be placed in a recess 122 in the top of the package 102 such that the top surface of the cover is flush with or somewhat recessed from the uppermost surface of the package. The cover 120 is generally spaced apart from the image sensor die 110.

The cover 120 may be a glass cover that allows image forming light to pass through to the image sensor, an infrared cut filter that prevents infrared radiation from passing through to the image sensor, a cover that provides an anti-reflective coating, or other material that seals the cavity 104 of the package 102 while allowing image forming light to fall on the light receiving surface such as the image sensor array 112 of the image sensor die 110.

A light absorbing layer 124 is applied to the cover to prevent light from falling on the substantially vertical surfaces 106 of the cavity 104 of the package 102 without preventing the passage of light that falls on the image sensor array 112 of the image sensor die 110. By preventing light from falling on the substantially vertical surfaces 106, the light absorbing layer 124 attenuates light that could reflect onto the image sensor array 112 of the image sensor die 110 and degrade the image formed. In the plan view of the image sensor assembly of FIG. 4, cross-hatching is used to suggest the light absorbing layer.

It is important that the light absorbing layer 124 be accurately aligned with the light receiving surface (image sensor array 112) of the image sensor die 110 so that the captured image is not affected by the light absorbing layer. It is desirable that the light absorbing layer 124 be closely fit to the image sensor array 112 so that the image sensor die 110 can be close to the vertical surfaces 106 to keep the package 102 compact. While the light absorbing layer 124 is shown not extending to the edges of the cover 120 to allow the light absorbing layer to be seen more clearly, it is preferable that the light absorbing layer extend to the edges of the cover to block all light except that which passes through the central opening in the light absorbing layer.

Preferably the light absorbing layer 124 is in registry with the image sensor array 112 within one hundred microns and more preferably within forty microns. This distance is not shown to scale in the figures so that the various elements can be more clearly seen. Registry of the light absorbing layer with the image sensor array within a given distance means that distance between the optical axes of the two components is no greater than the given distance. It also important that the light absorbing layer and the image sensor array be aligned closely with regard to rotational displacements. Since the light receiving surface, such as the image sensor array 112, is normally accurately located on the. image sensor die 110, it may be sufficient to align the light absorbing layer 124 with respect to the image sensor die 110.

The light absorbing layer 124 includes one or more openings 126 that provide a line-of-sight view 128 of two opposing corners of the image sensor die 110 to facilitate placing the cover 120 over the upper surface 108 of the package 102 in registry with the image sensor array 112.

Figure 5:
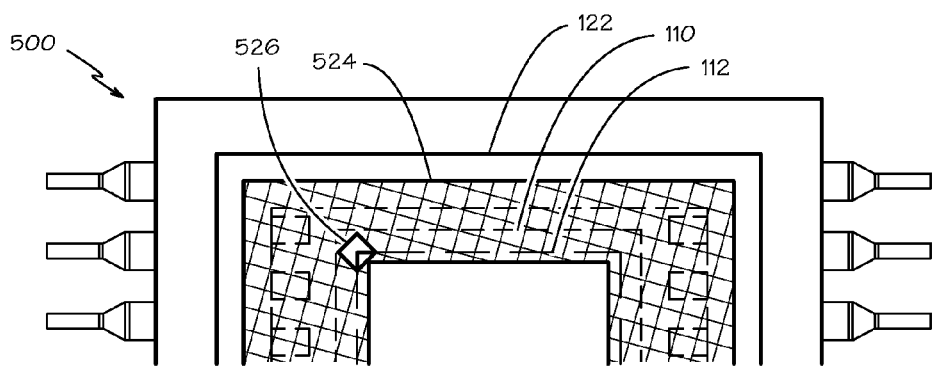
FIG. 5 is a plan view of another image sensor assembly that embodies the invention.

FIG. 5 shows a plan view of a portion of another image sensor assembly 500 that embodies the invention with cross-hatching to suggest the light absorbing layer 524. The opening 526 may be of any of a variety of shapes, such as square as shown. The openings 526 are shown providing a line-of-sight view of two opposing corners of the image sensor array 112 to facilitate placing the cover over the upper surface of the package in registry with the image sensor array. This image sensor assembly is otherwise similar to the preceding image sensor assembly.

Figure 6:
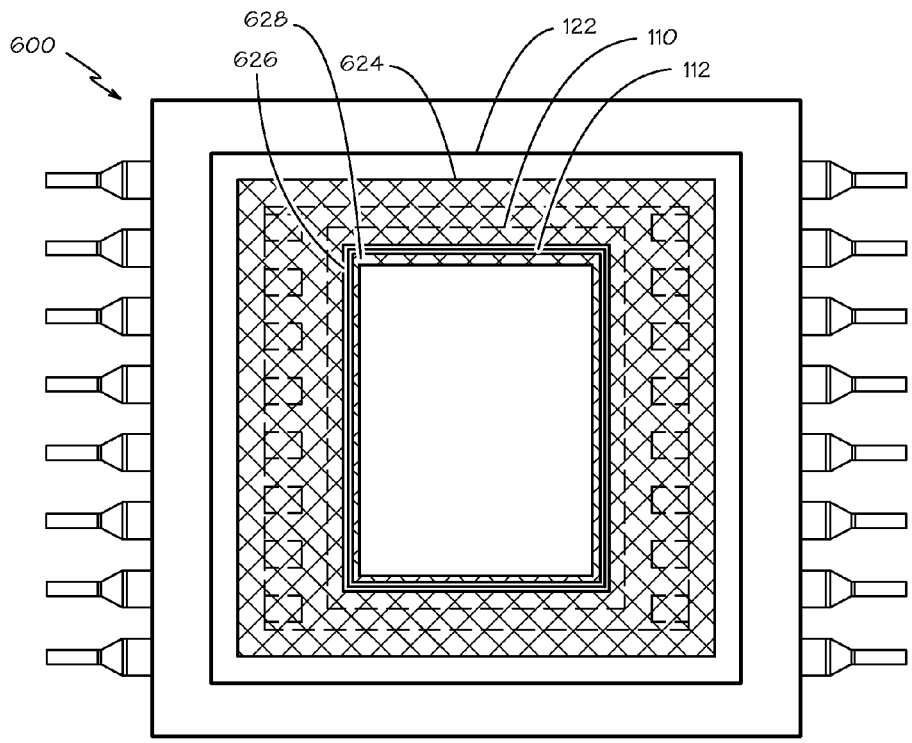
FIG. 6 is a plan view of yet another image sensor assembly that embodies the invention.

FIG. 6 shows a plan view of yet another image sensor assembly that embodies the invention with cross-hatching to suggest the light absorbing layer 624. The opening 626 is an open region that completely surrounds a light blocking frame 628 that is inset from the outer edges of the image sensor array 112. The opening 626 is shown providing a line-of-sight view of the entire periphery of the image sensor array 112 to facilitate placing the cover over the upper surface of the package in registry with the image sensor array. This image sensor assembly is otherwise similar to the preceding image sensor assemblies.

Figure 7:
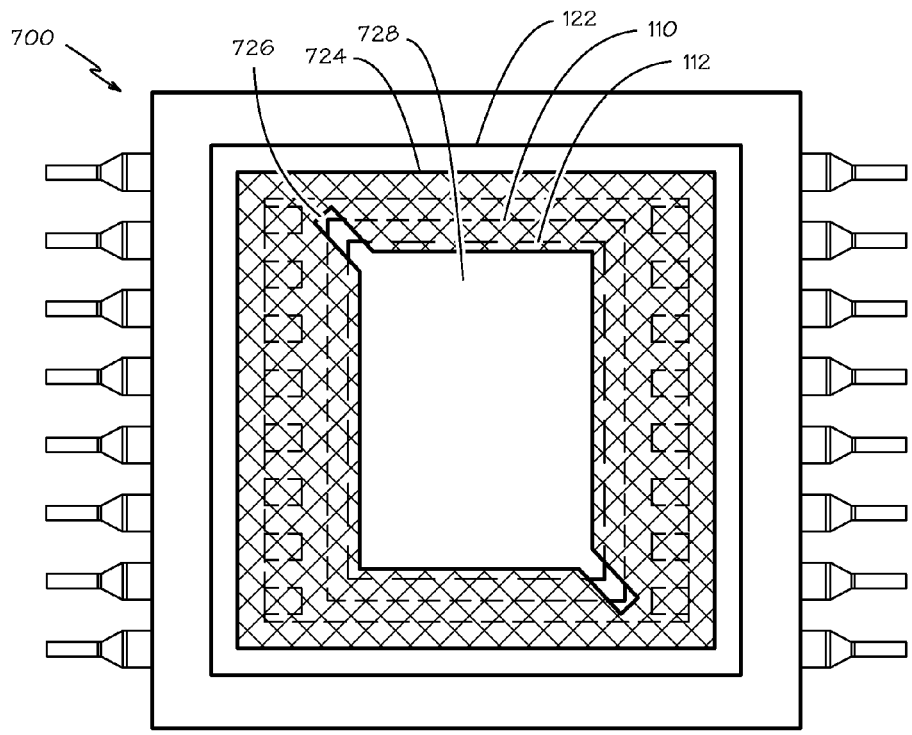
FIG. 7 is a plan view of still another image sensor assembly that embodies the invention.

FIG. 7 shows a plan view of yet another image sensor assembly that embodies the invention with cross-hatching to suggest the light absorbing layer 724. The one or more openings 726 are contiguous with the region 728 that permits the passage of light that falls on the image sensor array of the image sensor die. The openings 726 are shown providing a line-of-sight view of two opposing corners of both the image sensor array 112 and the image sensor die 110 to facilitate placing the cover over the upper surface of the package in registry with the image sensor array. This image sensor assembly is otherwise similar to the preceding image sensor assemblies.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those of ordinary skill in the art. More than two openings may be provided in some embodiments. The openings may be of different shapes and/or sizes from one another provided that the inner black mask border is sufficiently wide to block marginal rays from impinging on the vertical surface of the substrate. The openings may provide a line-of-sight view of the corners of a light receiving surface, such as an image sensor array, the image sensor die, or both. The openings provide a line-of-sight view of two opposing corners and may provide a view more than two corners. The description is thus to be regarded as illustrative instead of limiting.

What is claimed is:

1. An image sensor assembly comprising:
a preformed package that includes a cavity having substantially vertical surfaces extending from a lower surface to an upper surface of the package;
an image sensor die attached adjacent to the cavity and the lower surface of the preformed package, the image sensor die having a light receiving surface for capturing an image; and
a cover placed over the upper surface of the package, the cover including a light absorbing layer applied to the cover such that the light absorbing layer prevents light from falling on the substantially vertical surfaces of the preformed package without preventing passage of light that falls on the light receiving surface of the image sensor die, the light absorbing layer including one or more openings that provide a line-of-sight view of two opposing corners of at least one of the light receiving surface and the image sensor die.

2. The image sensor assembly of claim 1 wherein the one or more openings are exactly two openings.

3. The image sensor assembly of claim 2 wherein the two openings are circular.

4. The image sensor assembly of claim 1 wherein the one or more openings are an open region that completely surrounds a light blocking frame.

5. The image sensor assembly of claim 1 wherein the light absorbing layer includes a region that permits passage of light that falls on the light receiving surface of the image sensor die and the one or more openings are contiguous with the region.

6. The image sensor assembly of claim 1 wherein the cover is a glass cover that allows image forming light to pass through to the image sensor.

7. The image sensor assembly of claim 1 wherein the cover is an infrared cut filter that prevents infrared radiation from passing through to the image sensor.

8. The image sensor assembly of claim 1 wherein the cover is placed over the upper surface of the package with the light absorbing layer in registry with the image sensor die within one hundred microns.

9. The image sensor assembly of claim 1 wherein the cover is placed over the upper surface of the package with the light absorbing layer in registry with the image sensor die within forty microns.

10. A method of packaging an image sensor comprising:
attaching an image sensor die to a preformed package such that the image sensor die is located adjacent a cavity in the package with substantially vertical surfaces adjacent to a light receiving surface of the image sensor die; and
placing a cover over an upper surface of the package in registry with the image sensor die, the cover including a light absorbing layer applied to the cover such that the light absorbing layer prevents light from falling on the substantially vertical surfaces of the preformed package without preventing passage of light that falls on the light receiving surface of the image sensor die, the light absorbing layer including one or more openings that provide a line-of-sight view of two opposing corners of at least one of the light receiving surface and the image sensor die.

11. The method of claim 10 wherein the one or more openings are exactly two openings.

12. The method of claim 11 wherein the two openings are circular.

13. The method of claim 10 wherein the one or more openings are an open region that completely surrounds a light blocking frame.

14. The method of claim 10 wherein the light absorbing layer includes a region that permits passage of light that falls on the light receiving surface of the image sensor die and the one or more openings are contiguous with the region.

15. The method of claim 10 wherein the cover is a glass cover that allows image forming light to pass through to the image sensor.

16. The method of claim 10 wherein the cover is an infrared cut filter that prevents infrared radiation from passing through to the image sensor.

17. The method of claim 10 wherein the cover is placed over the upper surface of the package with the light absorbing layer in registry with the image sensor die within one hundred microns.

18. The method of claim 10 wherein the cover is placed over the upper surface of the package with the light absorbing layer in registry with the image sensor die within forty microns.

19. An image sensor assembly comprising:
means for packaging an image sensor die such that the image sensor die is located adjacent to a cavity with substantially vertical surfaces adjacent to a light receiving surface of the image sensor die;
means for covering an upper surface of the means for packaging that allows image forming light to pass through to the image sensor die;
means for absorbing light that is applied to the means for covering to prevent light from falling on the substantially vertical surfaces of the means for packaging the image sensor die without preventing passage of image forming light that falls on the light receiving surface of the image sensor die for capturing an image; and
means for providing a line-of-sight view of two opposing corners of at least one of the light receiving surface and the image sensor die through the means for absorbing light.

20. The image sensor assembly of claim 19 wherein the means for covering is a glass cover that allows image forming light to pass through to the image sensor.

21. The image sensor assembly of claim 19 wherein the means for covering is an infrared cut filter that prevents infrared radiation from passing through to the image sensor.

22. The image sensor assembly of claim 19 wherein the means for covering is placed over the upper surface of the means for packaging with the means for absorbing light in registry with the image sensor die within one hundred microns.

23. The image sensor assembly of claim 19 wherein the means for covering is placed over the upper surface of the means for packaging with the means for absorbing light in registry with the image sensor die within forty microns.

* * * * *